United States Patent
Kudo et al.

(10) Patent No.: US 9,704,552 B2
(45) Date of Patent: Jul. 11, 2017

(54) MULTI-LEVEL MAGNETIC RECORDING APPARATUS UTILIZING COOPERATIVE MAGNETIZATION DYNAMICS INDUCED BY SPIN-TORQUE OSCILLATOR

(71) Applicant: KABUSHIK KAISHA TOSHIBA, Tokyo (JP)

(72) Inventors: Kiwamu Kudo, Kanagawa (JP); Tazumi Nagasawa, Kanagawa (JP); Hirofumi Suto, Tokyo (JP); Koichi Mizushima, Kanagawa (JP); Rie Sato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/926,966

(22) Filed: Oct. 29, 2015

(65) Prior Publication Data

US 2016/0180906 A1   Jun. 23, 2016

(30) Foreign Application Priority Data

Dec. 22, 2014 (JP) ................................. 2014-258857

(51) Int. Cl.

| | | |
|---|---|---|
| *G11B 5/31* | (2006.01) | |
| *G11C 11/16* | (2006.01) | |
| *G11C 11/56* | (2006.01) | |
| *G11B 5/127* | (2006.01) | |
| *G11B 5/265* | (2006.01) | |
| *G11B 5/02* | (2006.01) | |
| *G11B 5/012* | (2006.01) | |

(52) U.S. Cl.

CPC .......... *G11C 11/161* (2013.01); *G11B 5/1278* (2013.01); *G11B 5/2654* (2013.01); *G11B 5/314* (2013.01); *G11C 11/1675* (2013.01); *G11C 11/5607* (2013.01); *G11B 5/012* (2013.01); *G11B 5/02* (2013.01); *G11C 11/1673* (2013.01)

(58) Field of Classification Search

CPC ...... G11B 5/1278; G11B 5/2654; G11B 5/314
USPC ............................................... 360/125.3, 121
See application file for complete search history.

(56) References Cited

U.S. PATENT DOCUMENTS 8,582,240 B1 * 11/2013 Chen ...................... G11B 5/399
360/125.3
9,019,754 B1 * 4/2015 Bedeschi ............. G11C 13/004
365/148

(Continued)

FOREIGN PATENT DOCUMENTS

| JP | 2007-281334 | 10/2007 |
|---|---|---|
| JP | 2009-80904 | 4/2009 |

(Continued)

*Primary Examiner* — Jefferson Evans
(74) *Attorney, Agent, or Firm* — Finnegan, Henderson, Farabow, Garrett & Dunner LLP

(57) ABSTRACT

According to one embodiment, a magnetic recording apparatus includes a spin-torque oscillator, a recording unit, and a controller. The spin-torque oscillator includes an oscillation layer. The recording unit includes at least one recording layer. Magnetization reversal in each recording layer is performed by excitation of cooperative dynamics between magnetization of the oscillation layer and magnetization of the recording layer. The controller controls precession of the magnetization of the oscillation layer, which is induced by application of an electric current to the spin-torque oscillator.

11 Claims, 11 Drawing Sheets

(56) References Cited

U.S. PATENT DOCUMENTS

| | | | |
|---|---|---|---|
| 9,142,228 B2* | 9/2015 | Fujita | G11B 5/23 |
| 9,230,571 B1* | 1/2016 | Chen | G11B 5/314 |
| 2009/0080109 A1 | 3/2009 | Fukuzawa et al. | |
| 2011/0279921 A1* | 11/2011 | Zhang | B82Y 10/00 |
| | | | 360/59 |
| 2012/0243308 A1 | 9/2012 | Saida et al. | |
| 2012/0314477 A1* | 12/2012 | Siau | G11C 8/08 |
| | | | 365/148 |
| 2013/0051134 A1 | 2/2013 | Kawahara et al. | |
| 2013/0070522 A1 | 3/2013 | Saida et al. | |
| 2013/0083423 A1* | 4/2013 | Shiroishi | G11B 5/3146 |
| | | | 360/75 |
| 2013/0335847 A1* | 12/2013 | Shiroishi | G11B 5/02 |
| | | | 360/46 |
| 2014/0104724 A1* | 4/2014 | Shiroishi | G11B 5/66 |
| | | | 360/75 |
| 2014/0233306 A1 | 8/2014 | Kent et al. | |
| 2014/0247520 A1 | 9/2014 | Yang et al. | |
| 2015/0333252 A1* | 11/2015 | Doyle | H01L 43/02 |
| | | | 257/421 |

FOREIGN PATENT DOCUMENTS

| | | |
|---|---|---|
| JP | 2010-206023 | 9/2010 |
| JP | 2012-204688 | 10/2012 |
| JP | 2013-69821 | 4/2013 |
| JP | 2014-502423 | 1/2014 |
| JP | 2014-41693 | 3/2014 |
| JP | 2014-170604 | 9/2014 |

\* cited by examiner u:Upward magnetization
d:Downward magnetization

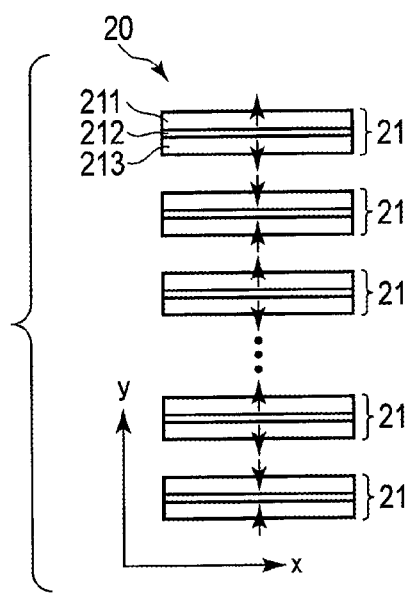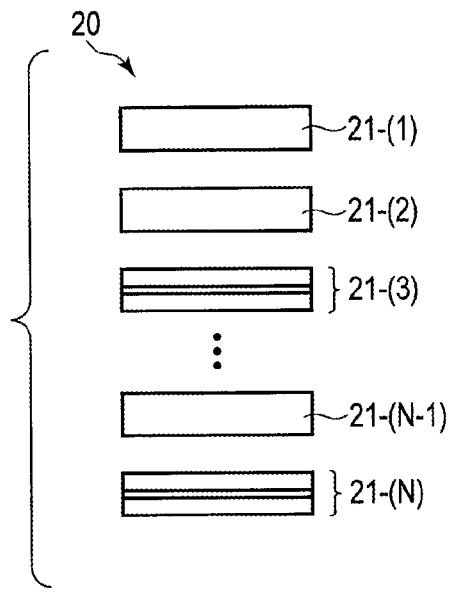
FIG. 8A    FIG. 8B
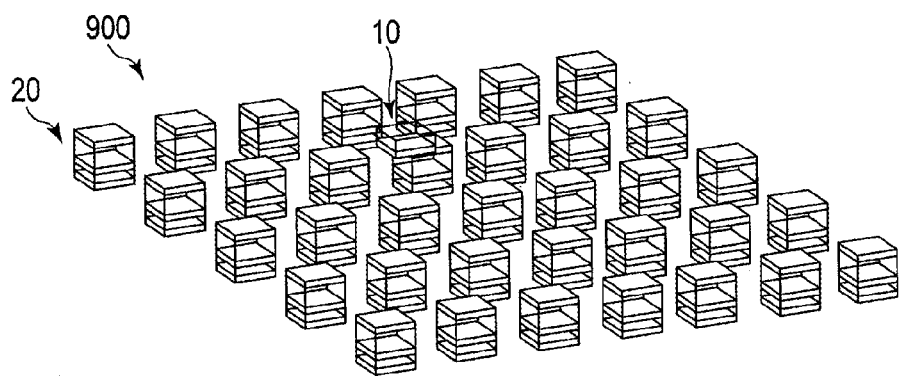
FIG. 9

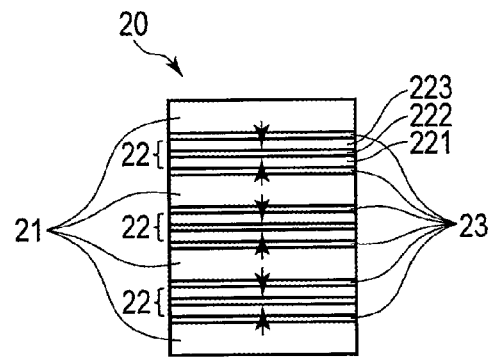 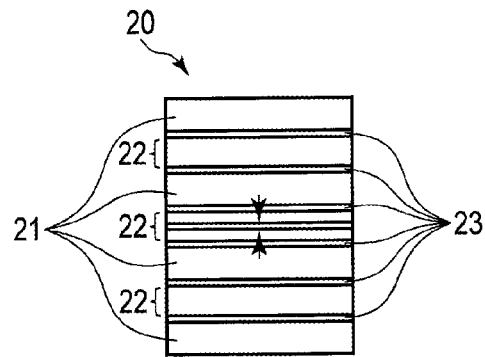
FIG. 14A  FIG. 14B
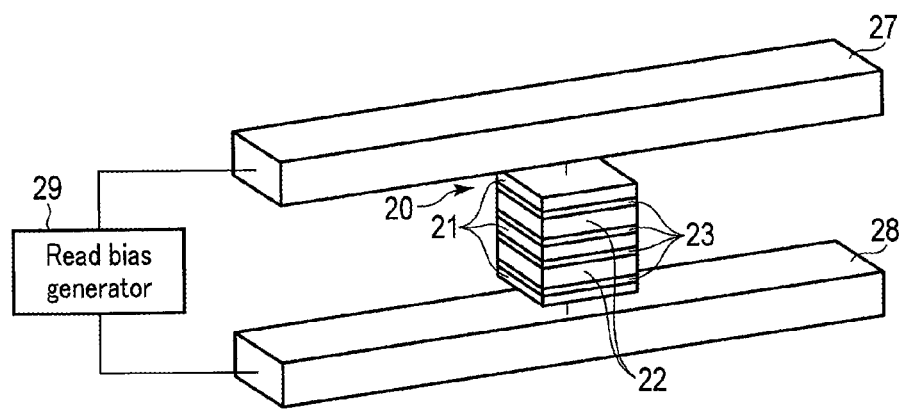
FIG. 15

MULTI-LEVEL MAGNETIC RECORDING APPARATUS UTILIZING COOPERATIVE MAGNETIZATION DYNAMICS INDUCED BY SPIN-TORQUE OSCILLATOR

CROSS-REFERENCE TO RELATED APPLICATIONS

This application is based upon and claims the benefit of priority from Japanese Patent Application No. 2014-258857, filed Dec. 22, 2014, the entire contents of which are incorporated herein by reference.

FIELD

Embodiments described herein relate generally to a magnetic recording apparatus.

BACKGROUND

A magnetization reversal assisting technique using a spin-torque oscillator (STO) is known. The magnetization reversal assisting technique is used in a magnetic recording apparatus such as an HDD (Hard Disk Drive) or spin transfer torque magnetic random access memory (MRAM). In the magnetization reversal assisting technique, the STO is used to assist a certain magnetization reversal (magnetization reversal using a write magnetic field in the HDD or magnetization reversal using a write current in the spin transfer torque MRAM). In a magnetic recording apparatus using the magnetization reversal assisting technique, a write device structure is complicated. Therefore, demands have arisen for a technique capable of causing magnetization reversal by using a simpler structure.

The MRAM is a nonvolatile memory. This means that stored data is not erased even when the power supply is turned off. Since the MRAM uses no electric power to hold stored data, an ICT (Information and Communication Technology) apparatus or the like can save energy. It is also known that the MRAM is capable of high-speed read/write.

Since the MRAM is nonvolatile and is capable of high-speed read/write as described above, technological development has been made on an MRAM for replacing a DRAM (Dynamic Random Access Memory). To replace a DRAM, it is necessary to increase the recording density from the present megabit class to a gigabit class. Also, as a memory hierarchy concept, there is a concept called a storage class memory (a memory device having intermediate-level performance between a DRAM and an SDD (Solid State Drive) in random access speed and recording density). For the MRAM to approach this storage class memory, it is necessary to further increase the recording density from the gigabit class.

The MRAM normally performs a binary operation by allocating recording bits "0" and "1" to a magnetization antiparallel state (high resistance $R_{AP}$) and magnetization parallel state (low resistance $R_P$) of a tunneling magnetoresistive effect (MTJ: Magnetic Tunnel Junction) element. The recording density can be increased by decreasing the memory cell size, but this downsizing has a limit. This is because there is a limit to the size by which element magnetization can maintain a data holding state (the parallel state or antiparallel state) for a long period. This limit is called a superparamagnetic limit, and a size of about 10 nm is regarded as the limit.

Given this background, to obtain a high recording density, a technique capable of recording multilevel data in each memory cell of the MRAM has been proposed.

BRIEF DESCRIPTION OF THE DRAWINGS

FIG. 8A is a view showing a recording unit in which all recording layers are formed by antiferromagnetically coupled films;

FIG. 8B is a view showing a recording unit in which some recording layers are formed by antiferromagnetically coupled films;

FIG. 9 is a view showing a magnetic recording apparatus including one STO and a plurality of recording units according to an embodiment;

FIG. 14A is a view showing a recording unit in which all reference layers are formed by antiferromagnetically coupled films;

FIG. 14B is a view showing a recording unit in which one reference layer is formed by an antiferromagnetically coupled film;

FIG. 15 is a view showing a system for reading data recorded in the recording unit;

DETAILED DESCRIPTION

According to one embodiment, a magnetic recording apparatus includes a spin-torque oscillator, a recording unit, and a controller. The spin-torque oscillator includes an oscillation layer. The recording unit includes at least one recording layer. Magnetization reversal in each recording layer is performed by excitation of cooperative dynamics between magnetization of the oscillation layer and magnetization of the recording layer. The controller controls precession of the magnetization of the oscillation layer, which is induced by application of an electric current to the spin-torque oscillator.

Embodiments will be described hereinafter with reference to the accompanying drawings. The embodiments are directed to a magnetic recording apparatus using a data write method based on cooperative dynamics between oscillation layer magnetization in a spin-torque oscillator and recording layer magnetization in a recording unit (magnetic recording medium).

Figure 1:
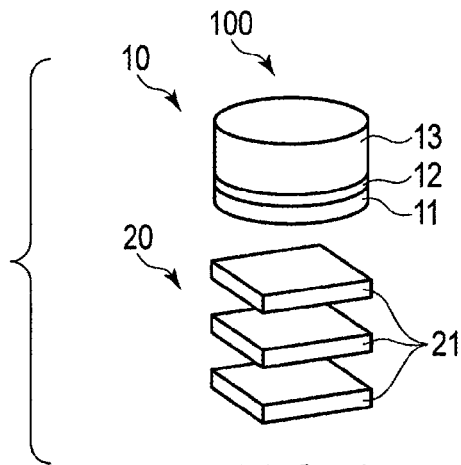
FIG. 1 is a view showing a magnetic recording apparatus according to an embodiment.

FIG. 1 schematically shows a magnetic recording apparatus 100 according to an embodiment. As shown in FIG. 1, the magnetic recording apparatus 100 includes a spin-torque oscillator (STO) 10 and a recording unit 20.

The STO 10 includes an oscillation layer 11, a polarizer layer 13, and an interlayer 12 provided between the oscillation layer 11 and polarizer layer 13. This structure in which three layers, i.e., the oscillation layer, interlayer, and polarizer layer are stacked is the most basic structure of the STO. This has been known since spin transfer torque technology was invented at the end of the 1990s.

Figure 2:
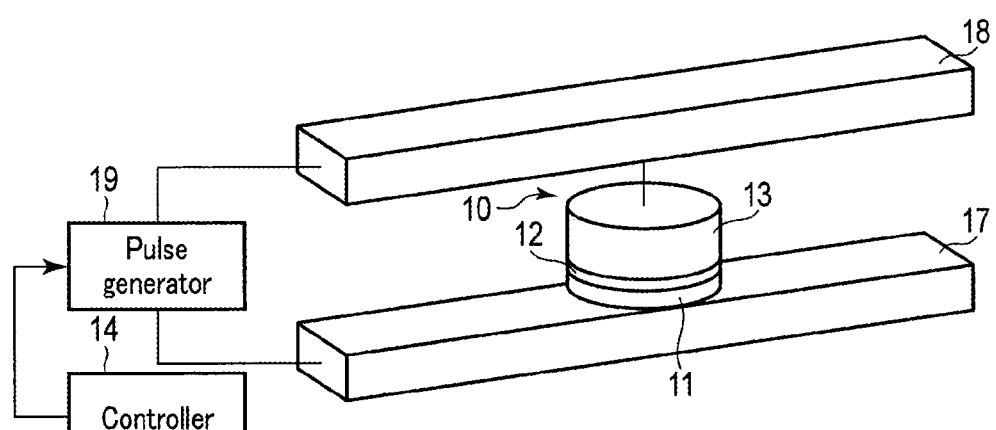
FIG. 2 is a view showing a system for controlling an STO shown in FIG. 1.

As shown in FIG. 2, the STO 10 is connected to a pair of electrodes 17 and 18. A pulse generator 19 is provided between the electrodes 17 and 18. The pulse generator 19 applies a pulsed electric current to the STO 10 via the electrodes 17 and 18. A controller 14 controls the pulse generator 19. The controller 14 controls the electric current to be supplied to the STO 10 in order to write data to the recording unit 20. The controller 14 operates in accordance with a current pulse generation program in which a current value is determined for each write step (to be described later).

When the electric current is supplied to the STO 10, the magnetization of the oscillation layer 11 precesses or oscillates at a frequency corresponding to the current value. Specifically, the electron's spins in the electric current is polarized by the magnetization of the polarizer layer 13, and the spin-polarized electric current acts on the magnetization of the oscillation layer 11, thereby inducing the precession of the magnetization of the oscillation layer 11. This phenomenon is called spin-transfer-torque-induced magnetization oscillation. The direction and frequency of the precession of the magnetization of the oscillation layer 11 are controlled by the electric current supplied to the STO 10. Therefore, the controller 14 controls the direction and frequency of the precession of the magnetization of the oscillation layer 11.

The recording unit 20 includes at least one recording layer 21. FIG. 1 shows an example in which the recording unit 20 includes three recording layers 21. The sectional shape of each recording layer 21 is a simple shape, e.g., a circular shape or a rectangular shape (including a rectangular shape having round corners). This sectional shape is the shape in a film plane corresponding to a plane perpendicular to the direction in which the recording layers 21 are stacked.

Figure 3:
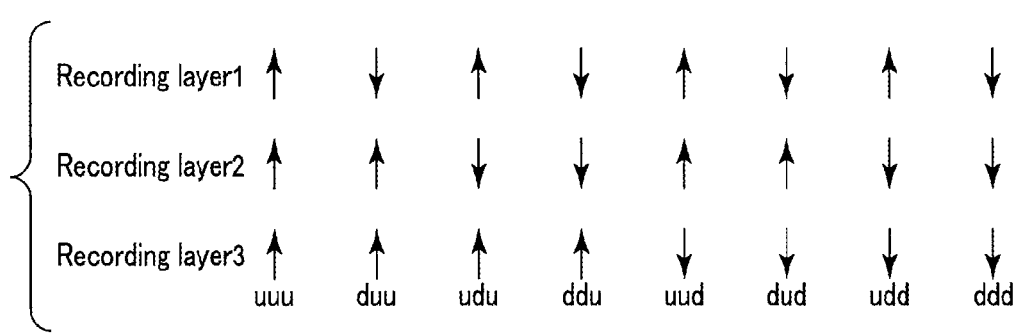
FIG. 3 is a view showing states which a recording unit shown in FIG. 1 can take.

In this embodiment, each recording layer 21 is formed by a perpendicular magnetization film. The magnetization of the recording layer 21 points one of two directions, i.e., upward and downward. The magnetization direction corresponds to data "0" or "1". For example, upward magnetization corresponds to data "0", and downward magnetization corresponds to data "1". In the following description, the magnetization direction is sometimes expressed by labeling the upward direction with u and the downward direction with d. When the recording unit 20 includes the three recording layers 21, their magnetization directions have eight combinations uuu, duu, udu, ddu, uud, dud, udd, and ddd as shown in FIG. 3. Referring to FIG. 3, the three recording layers 21 are labeled recording layers 1, 2, and 3 in this order from the one closest to the STO 10. The recording unit 20 including N recording layers 21 can express the states of $2^N$ levels where N is an integer of 1 or more.

The basic principle of a data write method according to this embodiment will be explained below. Magnetization reversal in each recording layer 21 is caused by cooperative dynamics between the magnetization of the oscillation layer 11 and the magnetization of the recording layer 21, which is excited based on the oscillation of the STO 10.

Figure 4A:
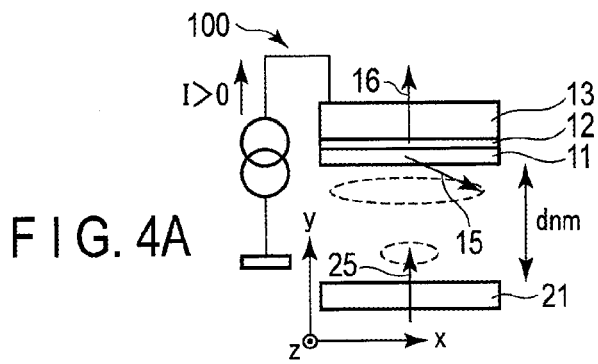
FIG. 4A is a view showing the setting of a numerical simulation.
Figure 4B:
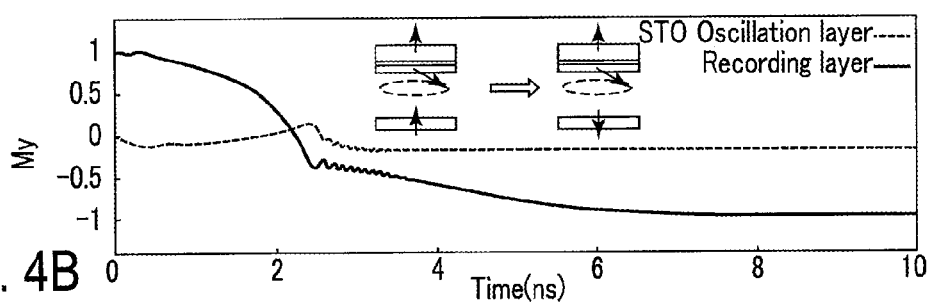
FIGS. 4B, 4C, and 4D are views showing the simulation results.
Figure 4C:
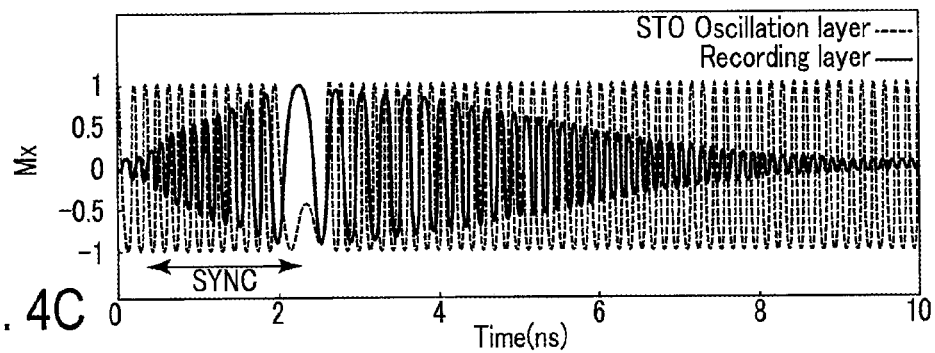
Figure 4D:
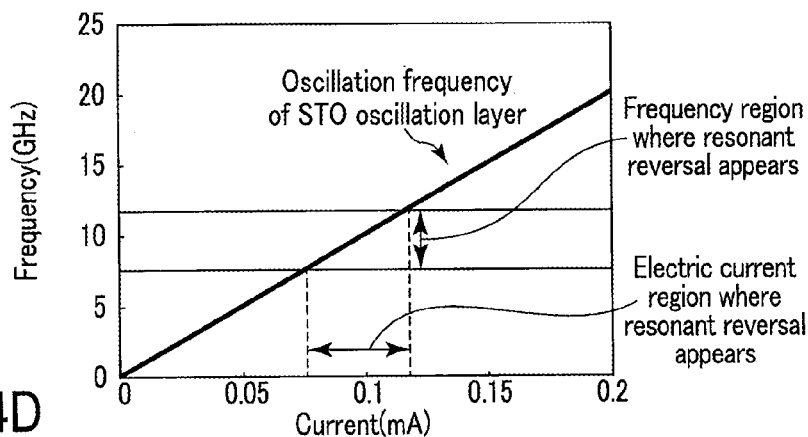

FIG. 4A shows the setting of a numerical simulation performed by the present inventors. FIG. 4A shows a case in which the recording unit 20 includes one recording layer 21 as an example, in order to reveal the cooperative dynamics. The x, y, and z directions are defined as shown in FIG. 4A. The x and z directions are parallel to the film plane of the recording layer 21, and the y direction is perpendicular to the film plane. A "+y direction" to be described below is a direction from the recording unit 20 to the STO 10, and perpendicular to the film plane of the recording layer 21. That is, the +y direction is "upward" in this specification. As shown in FIG. 4A, the STO 10 and recording layer 21 are arranged in the y direction. Both the STO 10 and recording layer 21 have columnar shapes. That is, the sectional shapes of both the STO 10 and recording layer 21 are circular, and the radii are 15 nm. A distance d between the oscillation layer 11 of the STO 10 and the recording layer 21 is 20 nm. The film thickness of the recording layer 21 is 5 nm. The STO 10 has the structure in which the polarizer layer 13, nonmagnetic interlayer 12, and oscillation layer 11 are stacked. The film thicknesses of the polarizer layer 13, nonmagnetic interlayer 12, and oscillation layer 11 are respectively 6, 1, and 3 nm. The polarizer layer 13, oscillation layer 11, and recording layer 21 are made of a magnetic material. The magnetic parameters of the polarizer layer 13, oscillation layer 11, and recording layer 21 are as follows. The polarizer layer 13, oscillation layer 11, and recording layer 21 respectively have saturation magnetizations Ms of 600, 1,400, and 700 emu/cm$^3$, perpendicular magnetic anisotropies Ku of 10, 1, and 2.8 Merg/cm$^3$, and magnetic attenuation coefficients α of 0.02, 0.02, and 0.01. As initial magnetization directions, the direction of magnetization 16 of the polarizer layer 13 is upward, that of magnetization 15 of the oscillation layer 11 is the z direction, and that of magnetization 25 of the recording layer 21 is upward. FIGS. 4B, 4C, and 4D show results obtained by performing LLG simulation of the magnetization dynamics of the polarizer layer 13, oscillation layer 11, and recording layer 21 under this setting. Note that LLG is an abbreviation of Landau-Lifshitz-Gilbert, and LLG simulation based on an LLG equation is a useful simulation method often used in the field of magnetic devices.

FIG. 4B shows time-series data of the y components of the magnetization 15 of the oscillation layer 11 and the magnetization 25 of the recording layer 21 when electric current I=0.90 mA is supplied to the STO 10. FIG. 4C shows corresponding time-series data of the x components. When a positive electric current is supplied to the STO 10, spin-polarized electrons flow from the oscillation layer 11 side to the polarizer layer 13 side, and the magnetization 15 of the oscillation layer 11 precesses clockwise with respect to the +y direction (i.e., in the direction of a right-hand screw pointing in the +y direction). When a negative electric current is supplied, the magnetization 15 of the oscillation layer 11 precesses counterclockwise with respect to the +y direction (i.e., in the direction of a left-hand screw pointing in the +y direction). The magnetization 16 of the polarizer layer 13 remains almost upward for time t=0 to 10 ns because the perpendicular magnetic anisotropy is large.

As shown in FIG. 4B, after the electric current is supplied at time t=0 ns, the magnetization 25 of the recording layer 21 reverses from upward in the initial state to downward under the influence of a oscillating dipole magnetic field generated by the precession of the magnetization 15 of the oscillation layer 11. In this magnetization reversing process, the STO 10 not only plays an active role as the oscillating magnetic field source for the magnetization 25 of the recording layer 21, but also passively behaves in the sense that the STO 10 receives a feedback of oscillation caused by the reversal of the magnetization 25 of the recording layer 21. The magnetization 15 of the oscillation layer 11 and the magnetization 25 of the recording layer 21 affect each other and cooperatively behave, and as a consequence the magnetization 25 of the recording layer 21 reverses in the final state. This cooperativeness is indicated by time-series data in a time region labeled SYNC (meaning synchronization) in FIG. 4C. In this time region, the magnetization 15 of the oscillation layer 11 and the magnetization 25 of the recording layer 21 operate so as to match the frequencies from moment to moment, and the reversal dynamics of the magnetization 25 is excited resonantly in the sense that the (instantaneous) frequencies match. In this example, the magnetization 25 of the recording layer 21 has the property in which the frequency decreases as an oscillation amplitude |Mx| increases, and the precession of the magnetization 15 of the oscillation layer 11 is caused so as to match with this property from moment to moment. This behavior can be regarded as the occurrence of magnetic resonance in real time. Also, in the time region labeled SYNC, a net energy transfer occurs from the STO 10 to the magnetization 25 of the recording layer 21. This is known from the fact that the amplitude of the precession of the magnetization 15 of the oscillation layer 11 temporarily decreases in this time region (see FIGS. 4B and 4C). From the foregoing, this magnetization reversal phenomenon will be called "resonant reversal" hereinafter.

FIG. 4D shows a current region where resonant reversal has occurred, which is plotted by operating the STO 10 set as shown in FIG. 4A within the current value range of 0 to 0.2 mA. A frequency straight line (STO oscillation fundamental frequency) proportional to the current value is the oscillation frequency of the magnetization 15 of the oscillation layer 11 when the magnetization 25 of the recording layer 21 is not present. The STO oscillation fundamental frequency is often called a free-running frequency. In this example, as shown in FIG. 4D, resonant reversal appears in a current region of 0.078 to 0.114 mA. A current value which gives the lower limit is given as a current value at which the oscillation frequency of the magnetization 15 of the oscillation layer 11 is the magnetic resonance frequency of the magnetization 25 of the recording layer 21. Thus, resonant reversal appears in a limited current region, i.e., in a corresponding limited STO oscillation fundamental frequency region. When the recording unit 20 includes a plurality of recording layers 21, multilevel write is performed by using this property of the STO oscillation frequency region where the occurrence of resonant reversal is limited in accordance with the magnetic resonance frequencies of the recording layers 21. The multilevel write will be explained in detail later.

The simulation results shown in FIGS. 4B, 4C, and 4D are obtained when a positive electric current is supplied and the magnetization 15 of the oscillation layer 11 precesses clockwise. When a negative electric current is supplied, the magnetization 25 of the recording layer 21, which initially points upward, keeps pointing upward without being influenced by the magnetization 15. This is because magnetization has a characteristic that it rotates in the direction of a right-hand screw with respect to an effective magnetic field. The magnetization of a perpendicular magnetization film such as the recording layer 21 receives an effective magnetic field in a direction in which the magnetization points, so when the magnetization 25 of the recording layer 21 is upward, the magnetization 25 rotates clockwise with respect to the +y direction. When the magnetization 25 of the recording layer 21 is downward, the magnetization 25 rotates counterclockwise with respect to the +y direction. Accordingly, when the magnetization 15 of the oscillation layer 11 precesses clockwise by a positive electric current, the magnetization 25 of the recording layer 21 that initially points upward is readily influenced by the magnetization 15 and shows resonant reversal in a predetermined current region. In contrast, when the magnetization 15 of the oscillation layer 11 precesses counterclockwise with respect to the +y direction by a negative electric current, the magnetization 25 of the recording layer 21 that initially points upward is not influenced by the magnetization 15. These actions are reversed when the magnetization 25 of the recording layer 21 initially points downward. That is, when the magnetization 15 of the oscillation layer 11 precesses counterclockwise by a negative electric current, the magnetization 25 of the recording layer 21 that initially points downward is readily influenced by the magnetization 15. When the magnetization 15 of the oscillation layer 11 precesses clockwise by a positive electric current, the magnetization 25 of the recording layer 21 that initially points downward is not influenced by the magnetization 15.

Note that the magnetization reversing method herein presented, i.e., resonant magnetization reversal based on cooperative dynamics, is a novel method. As a related art, a magnetization reversal assisting technique using an STO is known. Examples are microwave-assisted recording using an STO in an HDD technology, and magnetization reversal assist using an STO in a spin-transfer-torque (STT) MRAM. The above-described magnetization reversing method according to this embodiment differs from these related arts. The magnetization reversing method of this embodiment causes magnetization reversal by using only the STO 10, instead of using an STO in order to assist a given magnetization reversal (for example, magnetization reversal using a write magnetic field in an HDD or magnetization reversal using a write current in a STT MRAM).

Next, a data write method when the recording unit 20 includes a plurality of recording layers 21 will be explained. When the recording unit 20 includes a plurality of recording layers 21, data is written by using the property in which the STO oscillation fundamental frequency at which a resonant reversal occurs is limited in accordance with the magnetic resonance frequencies of the recording layers 21.

Figure 5A:
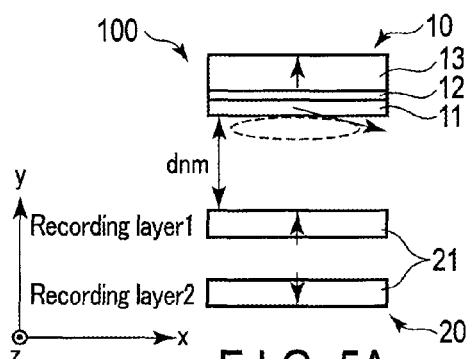
FIG. 5A is a view showing the setting of a numerical simulation.

FIG. 5A shows the setting of a numerical simulation performed by the present inventors. As shown in FIG. 5A, the STO 10 and two recording layers 21 are arranged in the y direction. In FIG. 5A, the two recording layers 21 are labeled Recording layer 1 and Recording layer 2 in this order from the one closer to the STO 10. In this specification, the two recording layers 21 will be described as a recording layer 21-(1) and recording layer 21-(2) in this order from the one closer to the STO 10. The STO 10 and two recording layers 21-(1) and 21-(2) have columnar shapes. That is, the sectional shapes of the STO 10 and two recording layers 21-(1) and 21-(2) are circular, and the radii are 15 nm. A distance d between the oscillation layer 11 of the STO 10 and the recording layer 21-(1) is 20 nm. The film thickness of the recording layer 21-(1) is 5 nm. The film thickness of the recording layer 21-(2) is also 5 nm. The distance between them is 5 nm. The STO 10 has the structure in which the polarizer layer 13, nonmagnetic interlayer 12, and oscillation layer 11 are stacked. The film thicknesses of the polarizer layer 13, nonmagnetic interlayer 12, and oscillation layer 11 are respectively 6, 1, and 3 nm. The polarizer layer 13, oscillation layer 11, and recording layers 21-(1) and 21-(2) are made of a magnetic material. The magnetic parameters of the polarizer layer 13, oscillation layer 11, recording layer 21-(1), and recording layer 21-(2) are as follows. The polarizer layer 13, oscillation layer 11, recording layer 21-(1), and recording layer 21-(2) respectively have saturation magnetizations Ms of 600, 1,400, 700, and 700 emu/cm³, and perpendicular magnetic anisotropies Ku of 10, 1, 3.3, and 2.3 Merg/cm³. All of the magnetic attenuation coefficients α of the polarizer layer 13, oscillation layer 11, recording layer 21-(1), and recording layer 21-(2) are 0.02. As initial magnetization directions, the direction of the magnetization 16 of the polarizer layer 13 is upward, and that of the magnetization 15 of the oscillation layer 11 is the z direction (in-plane direction). As the initial states of the recording unit 20, $2^2$ states uu, ud, du, and dd are adopted. For example, the state ud indicates that the magnetization direction of the recording layer 21-(1) is upward, and the magnetization direction of the recording layer 21-(2) is downward. FIGS. 5B, 5C, 5D, and 5E show results obtained by performing LLG simulation of the magnetization dynamics of the polarizer layer 13, oscillation layer 11, and recording layers 21-(1) and 21-(2) under this setting.

When a positive electric current is supplied to the STO 10 in this simulation setting, a spin-polarized electron stream flows from the oscillation layer 11 side to the polarizer layer 13 side, and the magnetization of the oscillation layer 11 precesses clockwise with respect to the +y direction. When a negative electric current is supplied, the magnetization of the oscillation layer 11 precesses counterclockwise with respect to the +y direction. As shown in FIG. 4D, the STO oscillation fundamental frequency is proportional to the current value. In this simulation, current application is performed by inputting a pulsed electric current having a rising time of 0.2 nsec and a duration of 8 nsec as shown in FIG. 5F or 5G at time t=1 ns. FIG. 5F shows a pulse shape when supplying a negative electric current, and FIG. 5G shows a pulse shape when supplying a positive electric current. When "a current value X is supplied" is described in the following explanation, the current value represents the maximum value (if X>0) or minimum value (if X<0) of the pulsed electric current. The magnetization of the polarizer layer 13 remains almost upward for time t=0 to 14 ns because of the large perpendicular magnetic anisotropy.

Figure 5B:
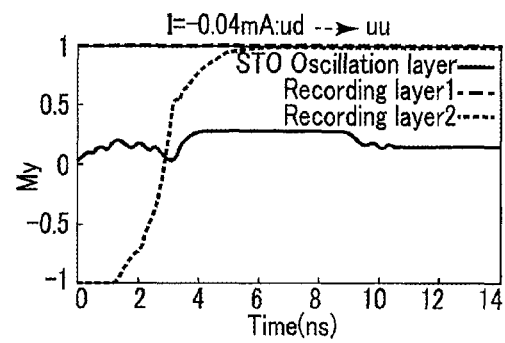
FIGS. 5B, 5C, 5D, and 5E are views showing the simulation results.
Figure 5C:
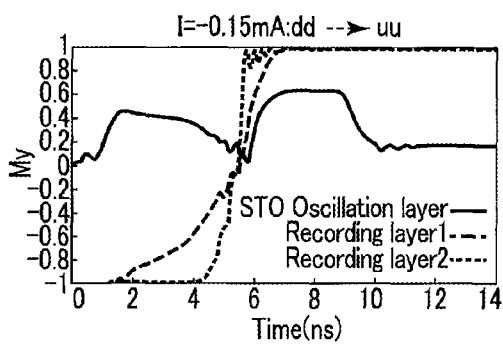
Figure 5D:
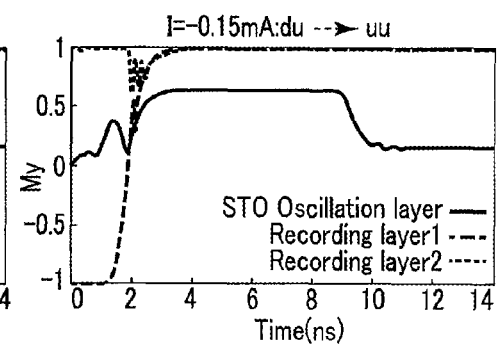
Figure 5E:
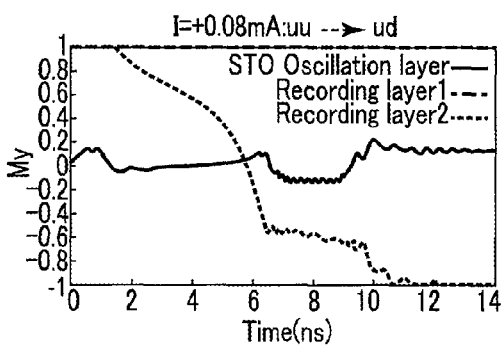
Figure 5F:
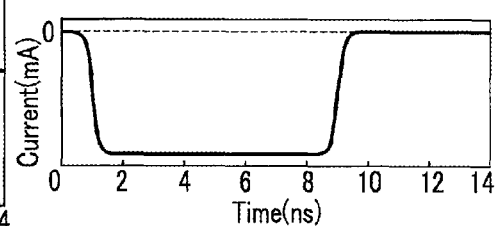
FIGS. 5F and 5G are views showing the waveforms of electric currents supplied to the STO in the simulation.
Figure 5G:
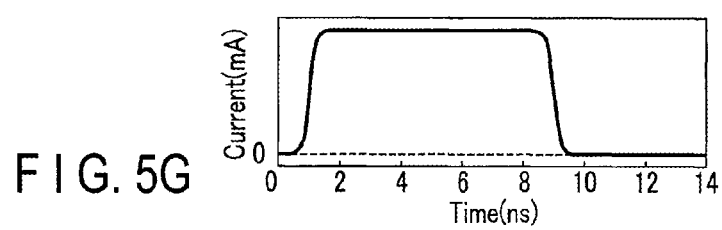

FIG. 5B shows that the recording unit 20 transitions from the initial state ud to the final state uu when a current value of −0.04 mA is supplied to the STO 10. FIG. 5C shows that the recording unit 20 transitions from the initial state dd to the final state uu when a current value of −0.15 mA is supplied to the STO 10. FIG. 5D shows that the recording unit 20 transitions from the initial state du to the final state uu when a current value of −0.15 mA is supplied to the STO 10. FIG. 5E shows that the recording unit 20 transitions from the initial state uu to the final state ud when a current value of +0.08 mA is supplied to the STO 10.

In addition to the results shown in FIGS. 5B, 5C, 5D, and 5E, the following results are obtained by performing the same simulation. The recording unit 20 transitions from the initial state uu to the final state dd when a current value of +0.16 mA is supplied to the STO 10. The recording unit 20 transitions from the initial state dd to the final state du when a current value of −0.08 mA is supplied to the STO 10. The recording unit 20 transitions from the initial state du to the final state du when a current value of +0.04 mA is supplied to the STO 10 (the magnetization of the recording layer 21-(2) does not reverse but stays in the state u).

In this example, a magnetic resonance frequency $f_1$ of the recording layer 21-(1) corresponds to an STO oscillation fundamental frequency given by I~±0.15 mA. Also, a magnetic resonance frequency $f_2$ of the recording layer 21-(2) corresponds to an STO oscillation fundamental frequency given by I~0.04 mA when the recording unit 20 is in the state du or ud, and corresponds to an STO oscillation fundamental frequency given by I~0.08 mA when the recording unit 20 is in the state uu or dd. As described previously with reference to FIG. 4D, the STO oscillation fundamental frequency at which resonant reversal occurs is limited in accordance with the magnetic resonance frequency of the recording layer 21. Due to this property, a correspondence appears between "controlling the direction and frequency of the precession of the magnetization of the oscillation layer" and "selecting a recording layer participating in the resonant reversal process". Controlling the direction and frequency of the precession of the magnetization of the oscillation layer 11 is executed by controlling (switching) electric currents to be supplied to the STO 10. In the magnetic recording apparatus 100 of this embodiment as described above, the magnetization reversing process such as the transition from the state uu to the state ud is determined by controlling the direction and frequency of the precession of the magnetization of the oscillation layer 11. That is, the recording layer 21 participating in the resonant reversal process is selected by controlling the direction and frequency of the precession of the magnetization of the oscillation layer 11.

For example, when there are two recording layers 21, i.e., the recording layers 21-(1) and 21-(2), the magnetic resonance frequency of the recording layer 21-(1) changes due to the influence of a stray magnetic field in accordance with whether the magnetization direction in the recording layer 21-(2) is u or d. When the recording unit 20 includes N recording layers 21, one of the recording layers 21 will be described as a recording layer 21-(*i*) where i is an integer of 1 to N. The magnetic resonance frequency of the recording layer 21-(*i*) is represented by $(\gamma/2\pi)H_i^{\text{eff}}$. $H_i^{\text{eff}}$ represents an effective magnetic field acting on the recording layer 21-(*i*), and γ represents a gyromagnetic ratio. The effective magnetic field $H_i^{\text{eff}}$ changes in accordance with stray magnetic fields corresponding to the magnetization directions in other recording layers 21. Therefore, the magnetic resonance frequency of the recording layer 21-(*i*) changes in accordance with the magnetization directions in other recording layers 21. The magnetic resonance frequency depends not only on the stray magnetic field, but also on the recording layer material and shape. Therefore, as in the above-mentioned example, the magnetic resonance frequency $f_1$ of the recording layer 21-(1) can be set higher than the magnetic resonance frequency $f_2$ of the recording layer 21-(2). "The magnetic resonance frequency $f_1$ is higher than the magnetic resonance frequency $f_2$" means that the minimum value of the magnetic resonance frequency which the recording layer 21-(1) can take is larger than the maximum value of the magnetic resonance frequency which the recording layer 21-(2) can take.

In the magnetic recording apparatus 100 of this embodiment, the magnetic resonance frequencies of the plurality of recording layers 21 are different so that the above-described corresponding relationship is established. In the above example, the perpendicular magnetic anisotropies Ku of the recording layers 21-(1) and 21-(2) are 3.3 and 2.3 Merg/cm$^3$, i.e., take different values, and this and the influence of a stray magnetic field make the values of the magnetic resonance frequencies $f_1$ and $f_2$ of the recording layers 21-(1) and 21-(2) different. Although the example in which N=2 has been explained above, the same shall apply even when N≥3.

As described above, the magnetic recording apparatus 100 according to this embodiment includes the STO 10 which includes the oscillation layer, and the recording unit 20 which includes at least one recording layer 21. There is a corresponding relationship between "controlling the direction and frequency of the precession of the magnetization of the oscillation layer 11" and "selecting the recording layer 21 participating in the resonant reversal process". Accordingly, the recording layer 21 as a write target can be selected by controlling the direction and frequency of the precession of the magnetization of the oscillation layer 11. Data is written to the selected recording layer 21 by excitation of cooperative dynamics between the magnetization of the oscillation layer 11 and that of the selected recording layer 21.

Figure 6:
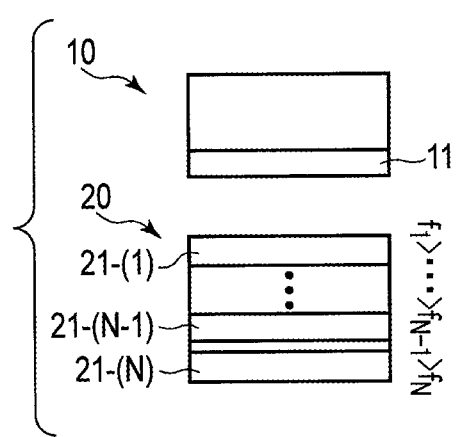
FIG. 6 is a view showing a design example of a magnetic resonance frequency when the recording unit includes a plurality of recording layers.

The magnetic resonance frequency of the recording layers 21 is desirably designed so as to decrease in a direction away from the oscillation layer 11 of the STO 10. As shown in FIG. 6, when recording layers are labeled from the layer closest to the oscillation layer 11 of the STO 10 as a recording layer 21-(1), recording layer 21-(2), . . . to recording layer 21-(N), and their magnetic resonance frequencies are $f_1, f_2, \ldots$ to $f_N$, then it holds that $f_1 > f_2 > \ldots$ to $> f_N$. A magnetic resonance frequency $f_i$ of the recording layer 21-(i) can be represented by $(\gamma/2\pi)H_i^{eff}$ by using the effective magnetic field $H_i^{eff}$ acting on the recording layer 21-(i). According to LLG simulation performed by the present inventors, whether or not cooperative dynamics occur between the magnetization of the oscillation layer 1 and that of the recording layer 21-(i) depends on the value of $H_{i\perp}^{dipole}/H_i^{eff}$ where $H_{i\perp}^{dipole}$ is the magnitude of a dipole magnetic field acting on the magnetization of the recording layer 21-(i) from the magnetization of the oscillation layer 11. The larger the value of $H_{i\perp}^{dipole}/H_i^{eff}$, the more easily cooperative dynamics occur. The dipole magnetic interaction has the property in which it decreases as the distance between two objects increases, so $H_{i\perp}^{dipole}$ decreases as the distance from the oscillation layer 11 increases. To maximize the value of $H_{i\perp}^{dipole}/H_i^{eff}$, it is therefore favorable to decrease the effective magnetic field $H_i^{eff}$ acting on the recording layer 21-(i). This makes it possible to maintain the ease with which cooperative dynamics occur even in the recording layer 21 at a distance from the oscillation layer 11. Decreasing the effective magnetic field $H_i^{eff}$ is equal to decreasing the magnetic resonance frequency. That is, the recording layer 21 is set so as to decrease the magnetic resonance frequency as the distance from the oscillation layer 11 increases (as i increases). This allows resonance reversal caused by cooperative dynamics to act on the recording layer 21 at a distance from the oscillation layer 11. That is, it is possible to further increase the number of recording layers 21 and the storage capacity.

The data write method of this embodiment performs a write operation by selecting the recording layer 21 in descending order of the magnetic resonance frequency. Consequently, multilevel data can reliably be written by N steps to the recording unit 20 including the N recording layers 21. This will be explained in detail below with reference to FIGS. 7A, 7B, and 7C.

Figure 7A:
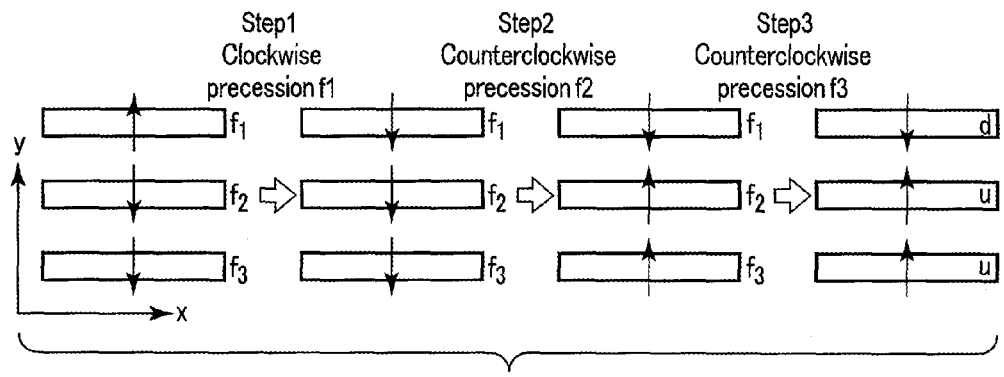
FIGS. 7A, 7B, and 7C are views showing procedure examples of data write.
Figure 7B:
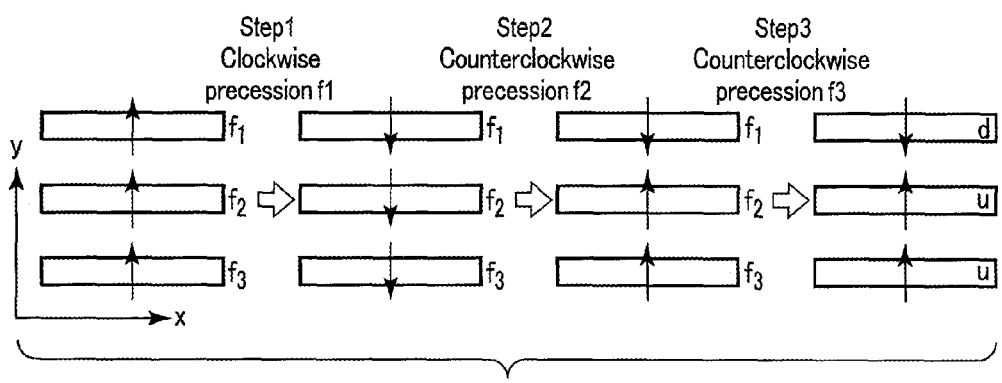
Figure 7C:
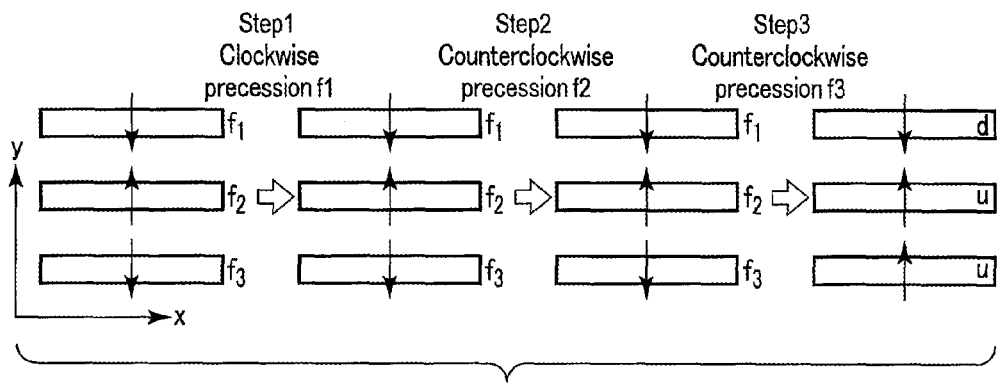

FIGS. 7A, 7B, and 7C show procedure examples of writing multilevel data when there are three recording layers 21. Specifically, FIGS. 7A, 7B, and 7C show procedure examples of setting the recording unit 20 in a state duu. This corresponds to writing multilevel data "011" to the recording unit 20, for example. Assume that the magnetic resonance frequencies of the three recording layers 21 are $f_1$, $f_2$, and $f_3$ and $f_1 > f_2 > f_3$ holds. In this embodiment, when there are three recording layers 21, writing multilevel data "011" is to selectively excite cooperative dynamics in the three recording layers 21 so that the recording unit 20 reaches the state duu from arbitrary $2^3$ (=8) states. The following steps may be performed to reach the state duu.

First, an electric current by which the magnetization of the oscillation layer 11 precesses clockwise with respect to the +y direction at a frequency of about $f_1$ is supplied to the STO 10, thereby exciting cooperative dynamics in the recording layer 21 having the magnetic resonance frequency $f_1$, and causing resonant reversal (step 1). Then, an electric current by which the magnetization of the oscillation layer 11 precesses counterclockwise with respect to the +y direction at a frequency of about $f_2$ is supplied to the STO 10, thereby exciting cooperative dynamics in the recording layer 21 having the magnetic resonance frequency $f_2$, and causing resonant reversal (step 2). Finally, an electric current by which the magnetization of the oscillation layer 11 precesses counterclockwise with respect to the +y direction at a frequency of about $f_3$ is supplied to the STO 10, thereby exciting cooperative dynamics in the recording layer 21 having the magnetic resonance frequency $f_3$, and causing resonant reversal (step 3).

Here the following point should be noted. As exemplified by the process in step 1 of FIG. 7B, resonant reversal is caused not only in the recording layer 21 having the magnetic resonance frequency $f_1$, but also in the recording layers 21 having the magnetic resonance frequencies $f_2$ and $f_3$. This is because when resonant reversal is caused in the recording layer 21 having a high resonance frequency, the recording layers 21 having lower resonance frequencies are influenced as well. An example like this is shown by the process in step 2 of FIGS. 7A and 7B. In addition, the LLG simulation example shown in FIG. 5C is an example of "a resonance reversal avalanche phenomenon" like this. This avalanche phenomenon occurs because the frequency of the magnetization vibration changes due to cooperative dynamics between the STO magnetization and recording layer magnetization in resonant reversal. As can be seen from the frequency of the magnetization vibration in the time region labeled SYNC in FIG. 4C, in the process during which the recording layer 21 reaches magnetization reversal, the frequency of the magnetization vibration due to cooperative dynamics decreases every moment. Therefore, when the resonant reversal process starts occurring from the maximum frequency $f_1$, for example, the precession frequency of the STO magnetization decreases and meets the frequency $f_2$ midway along the process. As a result, cooperative dynamics is simultaneously excited in the recording layer 21 having the magnetic resonance frequency $f_2$. From this viewpoint of the possibility of the avalanche phenomenon, the write step exemplified in step 1 FIG. 7B or step 2 of FIGS. 7A and 7B can be regarded as a step of correcting some kind of write error caused by the avalanche phenomenon. In this embodiment, a write operation is performed in sequence from the recording layer 21 having a high magnetic resonance frequency in the write operation by the STO 10, so multilevel data to be written to the recording unit 20 including the three recording layers 21 can be reliably written by three steps. Although the case in which N=3 has been explained in this embodiment, the same shall apply to a case in which N=2 or N≥4.

In the data write method of this embodiment, it is also possible to acquire information indicating current directions of magnetization in recording layers by reading multilevel data already recorded in the recording unit 20, and to perform a write operation by the excitation of cooperative dynamics after that. This makes it possible to reduce the write steps and shorten the write time. This will be explained in detail below by again referencing FIG. 7C.

FIG. 7C shows an example in which the write process from the state dud to the state duu is performed by three steps. It should be noted that in this process, steps 1 and 2 do not participate in data rewrite at all. If the present recording unit 20 knows that the current state is the state dud, transition from the state dud to the state duu can be performed by executing only the write step shown in step 3. Therefore, in the write operation by the STO 10, multilevel data already stored in the recording unit 20 is first read, and write is performed after that. This can reduce the write steps and shorten the write time.

At least one of the recording layers 21 in the recording unit 20 may also be formed by an antiferromagnetically coupled film. FIG. 8A shows an example in which all the recording layers 21 in the recording unit 20 are formed by antiferromagnetically coupled films. FIG. 8B shows an example in which some of a plurality of recording layers 21 are formed by antiferromagnetically coupled films. Specifically, in this example shown in FIG. 8B, the recording unit 20 includes N recording layers 21-(1) to 21-(N), and the recording layers 21-(3) and 21-(N) are formed by antiferromagnetically coupled films. As shown in FIG. 8A, the antiferromagnetically coupled film includes a first magnetic layer 211, a second magnetic layer 213, and an interlayer 212 arranged between the first and second magnetic layers 211 and 213. The interlayer 212 is made of a material such as ruthenium (Ru) which brings about antiferromagnetic coupling between the two magnetic layers.

When using the antiferromagnetically coupled films as the recording layers 21, a y-direction stray magnetic field between the recording layers 21 is reduced. This reduces the asymmetry of a resonant reversal occurrence region (a current region or STO oscillation fundamental frequency region where resonant reversal occurs) of recording layer magnetization. The asymmetry indicates a difference between a current value or STO oscillation fundamental frequency which causes a process of reversing the magnetization direction from u to d, and a current value or STO oscillation fundamental frequency which causes a process of reversing the magnetization direction from d to u. As a result, it is possible to reduce write errors in a write operation including "resonance reversal avalanche phenomena", and design a device which increases the number of recording layers.

If the asymmetry is large, it becomes difficult to design a device which increases the number of stackable recording layers, and which allocates STO oscillation fundamental frequencies accordingly. This is readily understandable because the resonant reversal occurrence region is a band-like region. Since the resonant reversal occurrence region is a band-like region, if the asymmetry is large, it is easy for a current value or an STO oscillation fundamental frequency which is common to the recording layers 21 and at which resonant reversal occurs to be present.

Note that in order to maximally reduce a stray magnetic field between the recording layers 21, it is of course preferable to equalize the magnetic volumes of the first and second magnetic layers 211 and 213.

Next, embodiments in which a plurality of recording units are formed will be explained. Each of these embodiments provides a large-capacity magnetic recording apparatus by forming a plurality of recording units.

FIG. 9 schematically shows a magnetic recording apparatus 900 according to an embodiment. As shown in FIG. 9, the magnetic recording apparatus 900 includes an STO 10, a plurality of recording units 20 arranged in a matrix, and a driving mechanism (not shown) which moves the STO 10 and the plurality of recording units 20 relative to each other. In a write operation, the STO 10 moves close to the recording unit 20 as a write target. The structure of the STO 10, the structure of each recording unit 20, and a data write method are the same as those described above with reference to FIGS. 1 through 8B, so a repetitive explanation will be omitted.

Figure 10:
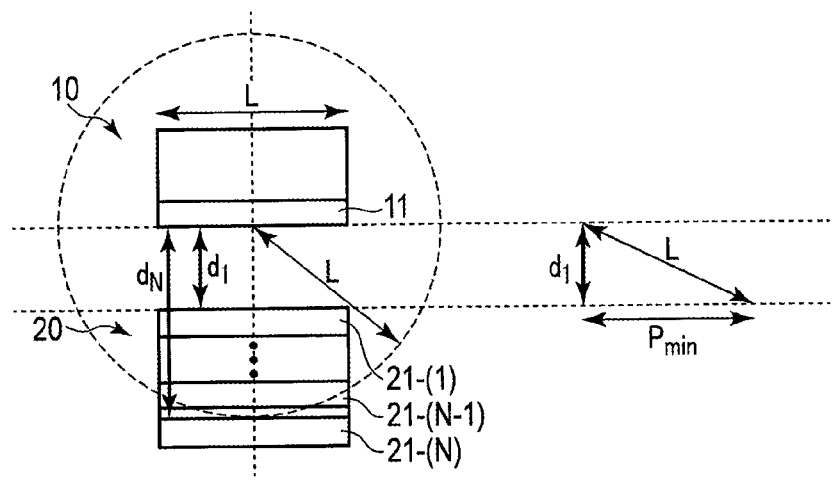
FIG. 10 is a view for explaining a write enable range.

The distance between the STO 10 and recording unit 20 at which write is possible will be explained with reference to FIG. 10. In FIG. 10, the size of the STO 10 is represented by L, and a range within which a write operation is possible is indicated by the dotted circle. This dotted circle is drawn around the central position of the surface of an oscillation layer 11 of the STO 10, which faces the recording unit 20. This write enable range indicates a spatial range in which resonant reversal of the magnetization of a recording layer 21 appears based on cooperative dynamics between the magnetization of the oscillation layer 11 and that of the recording layer 21. The recording unit 20 includes N recording layers 21, and the N recording layers 21 are labeled a recording layer 21-(1), recording layer 21-(2), . . . to recording layer 21-(N) from the one closest to the STO 10. Let $d_1, d_2, \ldots$ to $d_N$ be the distances between the recording layers 21-(1), 21-(2), . . . to 21-(N) and the oscillation layer 11 of the STO 10. According to LLG simulation performed by the present inventors, the write enable range is a range within which the distance from the central position of the surface of the oscillation layer 11, which faces the recording unit 20, is equal to or smaller than the size L of the STO 10. This demonstrates that when the distance between adjacent recording units 20 is smaller than minimum pitch $P_{min}=\sqrt{L^2-d^2}$, shown in FIG. 10, cooperative dynamics sometimes occur between the STO 10 and the recording layer 21 of the recording unit 20 adjacent to the recording unit 20 as a write target. To prevent such an operation error, the pitch of the recording units 20 is desirably made larger than $P_{min}$ when arranging a plurality of recording units 20.

The above-mentioned spatial range, in which resonant reversal of the magnetization of the recording layer 21 appears based on cooperative dynamics between the magnetization of the oscillation layer 11 and that of the recording layer 21, exists because the cooperative dynamics derives from dipole interaction between the magnetization of the oscillation layer 11 and that of the recording layer 21, and the dipole interaction has the property in which it decreases as the distance between two objects increases.

Figure 11:
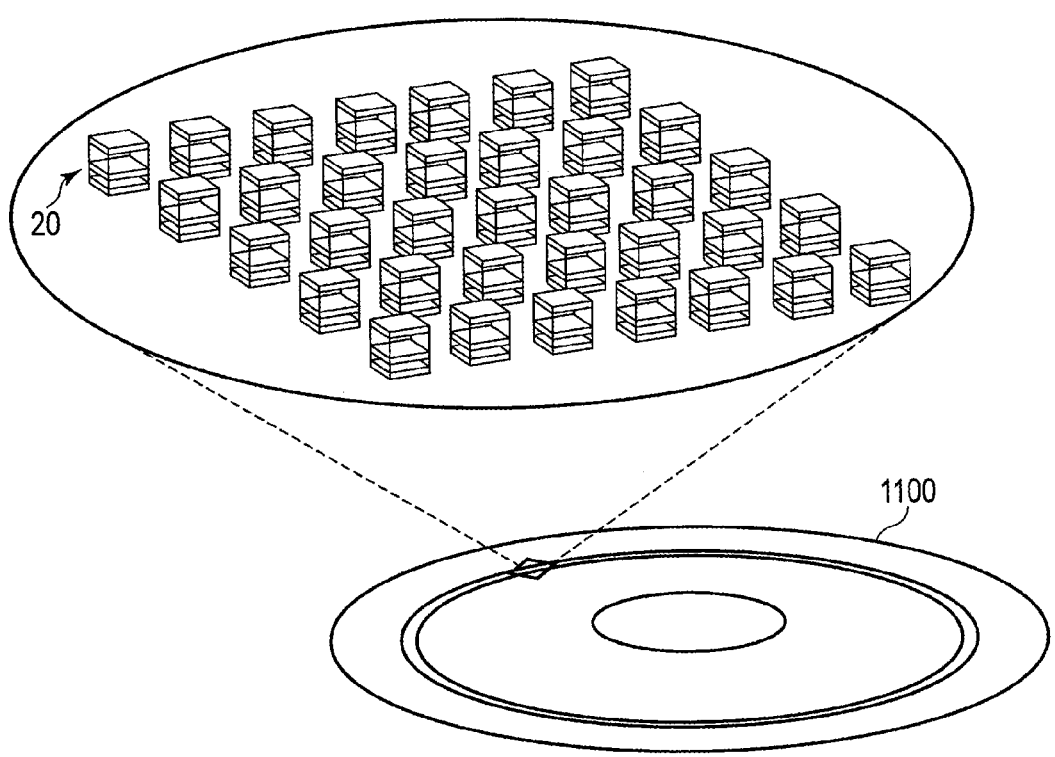
FIG. 11 is a view showing a magnetic recording medium according to an embodiment.

The array of the plurality of recording units 20 is not limited to the matrix shown in FIG. 9. For example, as shown in FIG. 11, the plurality of recording units 20 may also be arranged along a ring-like track formed on a magnetic recording medium 1100, like a bit-patterned medium in the HDD recording medium technology. The pitch of the recording units 20 is desirably made larger than $P_{min}$ in this case as well. This provides an HDD technology which replaces the magnetic data write method of the present HDD technology with the resonant reversal method of the magnetization of the recording layer 21, based on cooperative dynamics between the magnetization of the oscillation layer 11 and that of the recording layer 21. In the resonant reversal method of the magnetization of the recording layer 21 based on cooperative dynamics between the magnetization of the oscillation layer 11 and that of the recording layer 21, no external magnetic field is necessary to reverse the recording layer magnetization, and this obviates the need for a magnetic field generating pole of a write head used in the present HDD technology, or the like. Accordingly, a write head simpler than the conventional write head is provided.

Figure 12:
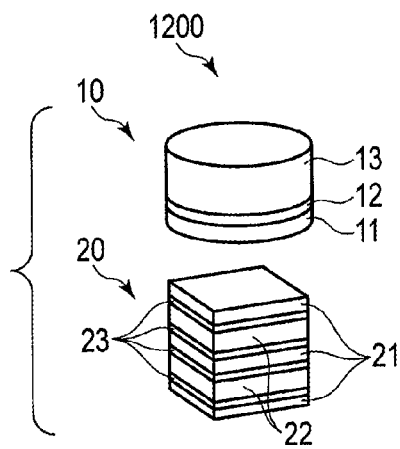
FIG. 12 is a view showing a memory cell according to an embodiment.

A magnetic recording apparatus according to an embodiment includes a plurality of memory cells 1200 each shown in FIG. 12. Each memory cell 1200 includes an STO 10 and recording unit 20. In this embodiment, a plurality of STOs 10 are provided opposite to a plurality of recording units 20. As shown in FIG. 12, each recording unit 20 has a multilayered structure including a plurality of recording layers 21, a plurality of reference layers 22, and a plurality of spacer layers 23. The recording layers 21 and reference layers 22 are made of a magnetic material, and the spacer layers 23 are made of a nonmagnetic metal or an insulator. The structure of the STO 10 and a data write method are the same as those described above with reference to FIGS. 1 through 8B, so a repetitive explanation will be omitted.

In the recording unit 20 shown in FIG. 12, the recording layer 21, spacer layer 23, reference layer 22, spacer layer 23, recording layer 21, spacer layer 23, reference layer 22, spacer layer 23, and recording layer 21 are stacked in this order. In this multilayered structure of the recording unit 20, the stacking order of the recording layer 21, reference layer 22, and spacer layer 23 is a recording layer/spacer layer/reference layer, or reference layer/spacer layer/recording layer when viewed partially. A three-layered structure like this is a magnetoresistive effect film structure, and is configured so that the element resistance of the recording unit 20 becomes a low resistance ($R_P$) or high resistance ($R_{AP}$) in accordance with whether the magnetization of the recording layer 21 and that of the reference layer 22 are parallel or antiparallel as in a TMR element. FIG. 12 shows an example in which the number of recording layers 21 is three. The recording unit 20 has a structure which can be regarded as stacking TMR elements sharing the reference layer 22. The sectional shape of the multilayered structure is a simple shape, e.g., a circular shape or a rectangular shape (including a rectangular shape having round corners). FIG. 12 schematically shows a multilayered structure in which each layer has a uniform sectional area, but the sectional areas may also be made nonuniform by tapering or the like. When the number of recording layers 21 is one or two, one reference layer 22 may be provided.

Figure 13:
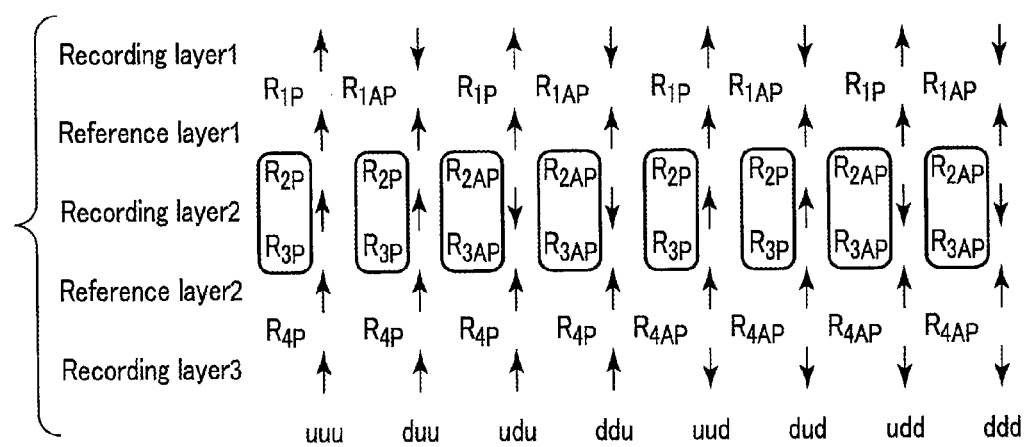
FIG. 13 is a view showing states that a recording unit shown in FIG. 12 can take.

Data read is performed by detecting the element resistance of the recording unit 20. FIG. 13 shows a total of eight cases in each of which the magnetizations of the two reference layers 22 of the recording unit 20 shown in FIG. 12 are fixed upward (u) and the magnetizations of the three recording layers 21 are upward (u) or downward (d). The element resistance of the recording unit 20 is given as the serial sum of the resistance values $R_P$ and $R_{AP}$ determined in accordance with whether the magnetizations of the recording layer 21 and reference layer 22 between which the spacer layer 23 is interposed are parallel or antiparallel. For example, when the magnetizations of the three recording layers 21 are udu from the uppermost one, the element resistance of the recording unit 20 is $R_{1P}+R_{2AP}+R_{3AP}+R_{4P}$ except for offset by the resistance of a lead wire or the like. It is well known that in a TMR element, the magnetoresistive effect ratio can be adjusted based on the material and film thickness of a spacer layer or the magnetic material of a recording layer and reference layer, etc. The recording unit 20 including the three recording layers 21 is designed so that eight element resistances $R_{1P}+R_{2P}+R_{3P}+R_{4P}$, $R_{1AP}+R_{2P}+R_{3P}+R_{4P}$, $R_{1P}+R_{2AP}+R_{3AP}+R_{4P}$, $R_{1AP}+R_{2AP}+R_{3AP}+R_{4P}$, $R_{1P}+R_{2P}+R_{3P}+R_{4AP}$, $R_{1AP}+R_{2P}+R_{3P}+R_{4AP}$, $R_{1P}+R_{2AP}+R_{3AP}+R_{4AP}$, $R_{1AP}+R_{2AP}+R_{3AP}+R_{4AP}$ are different. That is, the recording unit 20 including the N recording layers 21 can take $2^N$ element resistances different from each other.

At least one of the reference layers 22 in the recording unit 20 may also be formed by an antiferromagnetically coupled film having a multilayered structure including a magnetic layer/interlayer/magnetic layer. FIG. 14A shows an example in which all the reference layers 22 are formed by antiferromagnetically coupled films when the recording unit 20 includes four recording layers 21. FIG. 14B shows an example in which some of the reference layers 22 are formed by antiferromagnetically coupled films when the recording unit 20 includes four recording layers 21. As shown in FIG. 14A, the antiferromagnetically coupled film includes a first magnetic layer 221, a second magnetic layer 223, and an interlayer 222 arranged between the first and second magnetic layers 221 and 223. The interlayer 222 is made of a material such as Ru which brings about antiferromagnetic coupling between the two magnetic layers. When using the antiferromagnetically coupled film as the reference layer 22, a y-direction stray magnetic field acting from the reference layer 22 to the recording layer 21 is reduced. This reduces the asymmetry of a resonant reversal occurrence region (an STO input current region or STO oscillation fundamental frequency region where resonant reversal occurs) of recording layer magnetization. As a result, it is possible to reduce write errors in a write operation, and design a device which maximizes the number of recording layers.

Note that in the recording unit 20 in which at least one reference layer 22 is formed by an antiferromagnetically coupled film, at least one of the recording layers 21 may also be formed by an antiferromagnetically coupled film, as explained with reference to FIGS. 8A and 8B.

As shown in FIG. 15, the recording unit 20 is connected to a pair of electrodes 27 and 28. A read bias generator 29 is provided between the electrodes 27 and 28. The read bias generator 29 applies a bias to the recording unit 20 via the pair of electrodes 27 and 28, in order to read out data recorded in the recording unit 20. The resistance value of the recording unit 20 is detected by measuring the magnitude of an electric current flowing through the recording unit 20, and converted into data by a decoder (not shown).

Figure 16:
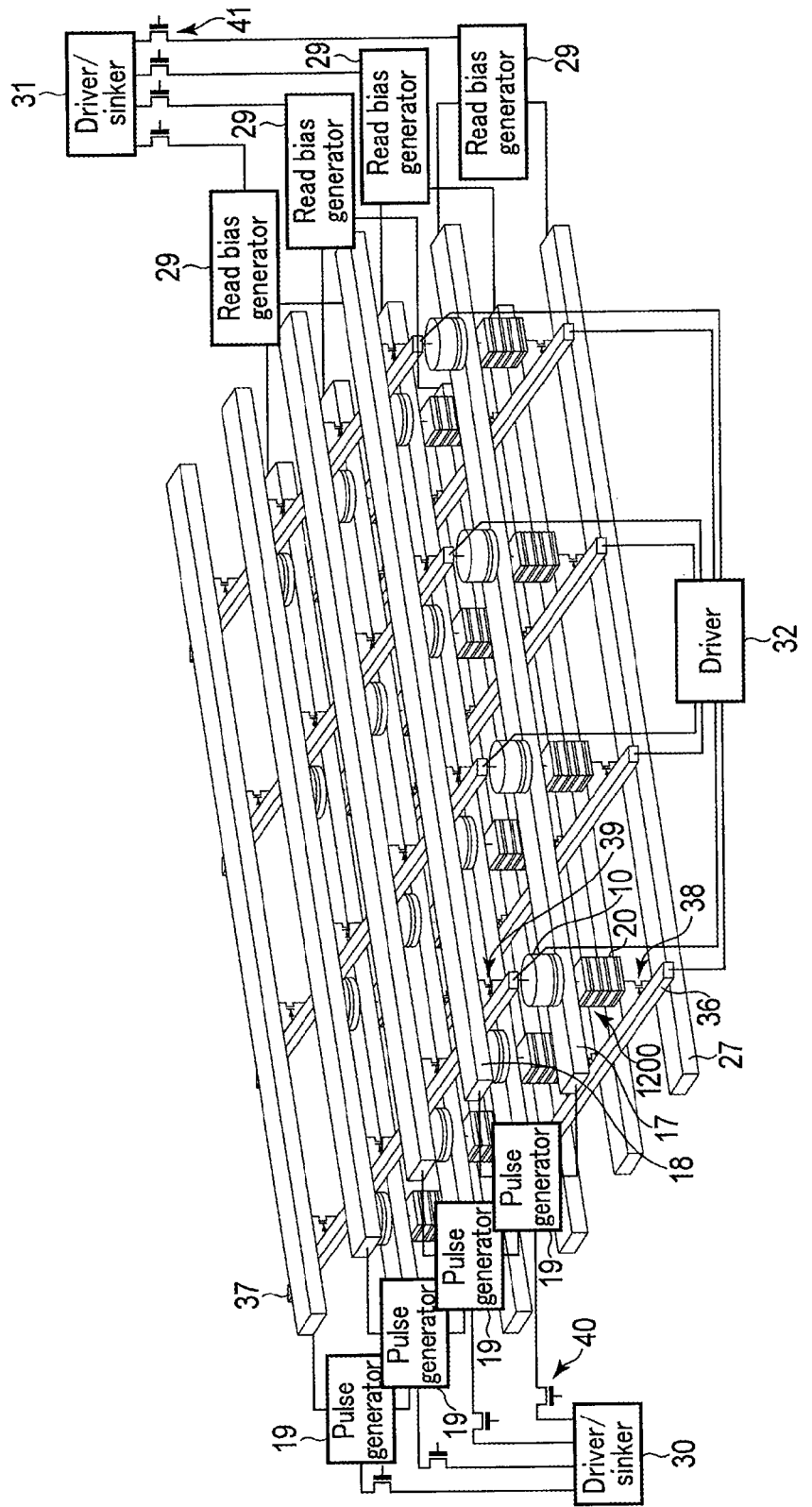
FIG. 16 is a view showing a magnetic recording apparatus including a plurality of STOs and a plurality of recording units according to an embodiment.

In a magnetic recording apparatus including a plurality of memory cells 1200, as shown in FIG. 16, the memory cells 1200 may be arranged in a matrix form, and the pulse generator 19 shown in FIG. 2 and the read bias generator 29 shown in FIG. 15 are provided for each of lines corresponding to bit lines in the MRAM technology. In this example shown in FIG. 16, sixteen memory cells 1200 are arranged in 4 rows and 4 columns. Electrodes 17, 18 and 27 extending in a first direction are provided, and lines 36 and 37 extending in a second direction intersecting with the first direction are provided. The recording unit 20 and a selection transistor 38 controlled by the line 36 are arranged between the electrodes 27 and 17. The STO 10 and a selection transistor 39 controlled by the line 37 are arranged between the electrodes 17 and 18.

The pulse generator 19 is connected to the electrodes 17 and 18. A driver/sinker 30 drives the pulse generator 19. A selection transistor 40 is inserted between the pulse generator 19 and driver/sinker 30. In addition, the read bias generator 29 is connected to the electrodes 27 and 17. A driver/sinker 31 drives the read bias generator 29. A selection transistor 41 is inserted between the read bias generator 29 and driver/sinker 31. The lines 36 and 37 are connected to a driver 32. The selection transistors 39 and 40 select the STO 10, and the selection transistors 38 and 41 select the recording unit 20.

Figure 17:
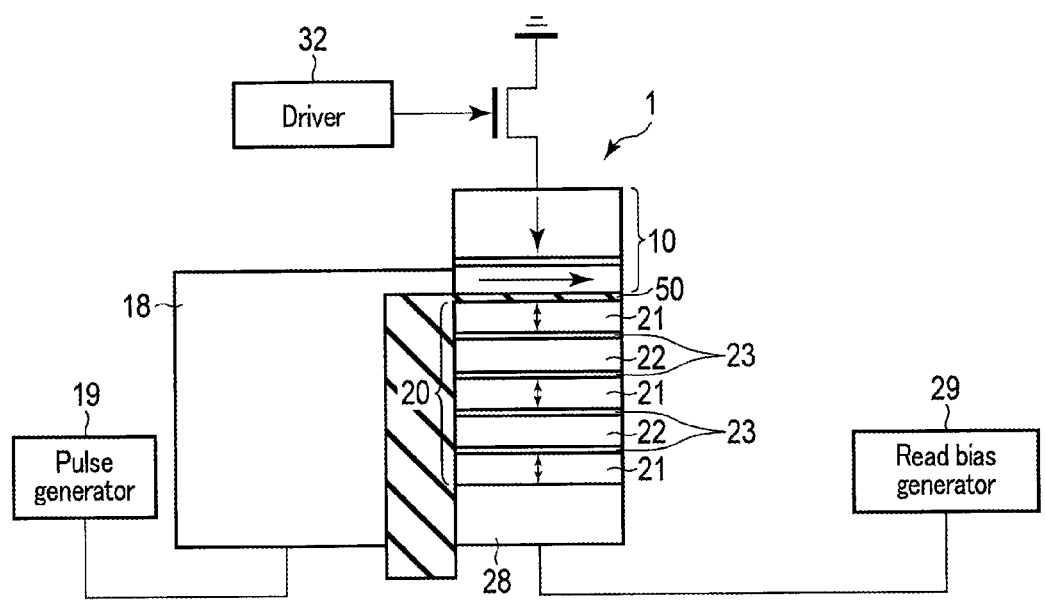
FIG. 17 is a view showing an example in which an STO is stacked on a recording unit with an insulator layer being interposed between them.

As shown in FIG. 17, the STO 10 may also be stacked on the recording unit 20 with an insulator layer 50 being interposed between them. The distance between the oscillation layer 11 of the STO 10 and the recording unit 20 can be shortened by decreasing the film thickness of the insulator layer 50. As described earlier, the shorter the distance between the oscillation layer 11 and recording layer 21, the more easily resonant reversal occurs. As in the example shown in FIG. 17, more recording layers can therefore be included in the recording unit by shortening the distance between the oscillation layer 11 of the STO 10 and the recording unit 20. Consequently, a multilayered magnetic memory having a larger capacity is provided.

In at least one of the embodiments explained above, magnetization reversal is executed by the excitation of cooperative dynamics between the oscillation layer magnetization in the STO and the recording layer magnetization in the recording unit. That is, the magnetization of the recording layer can be reversed by using only the STO. This embodiment can perform data write by using a simple arrangement.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic recording apparatus comprising:
   a spin-torque oscillator including an oscillation layer;
   a recording unit including a plurality of recording layers having different magnetic resonance frequencies, wherein magnetization reversal in each recording layer is performed by excitation of cooperative dynamics between magnetization of the oscillation layer and magnetization of the recording layer; and
   a controller controlling precession of the magnetization of the oscillation layer, which is induced by application of an electric current to the spin-torque oscillator, wherein the controller controls a frequency of the precession to select a recording layer of a write target from the plurality of recording layers.

2. The apparatus according to claim 1, wherein the plurality of recording layers has lower magnetic resonance frequencies as the plurality of recording layers are father apart from the oscillation layer of the spin-torque oscillator.

3. The apparatus according to claim 1, wherein the controller writes data in the plurality of recording layers in descending order of the magnetic resonance frequencies.

4. The apparatus according to claim 1, wherein the controller writes data in the recording unit after reading data recorded in the recording unit.

5. The apparatus according to claim 1, wherein at least one of the plurality of recording layers comprises an anti-ferromagnetically coupled film.

6. The apparatus according to claim 1, further comprising an electric current source which supplies the electric current.

7. The apparatus according to claim 1, comprising a plurality of recording units.

8. The apparatus according to claim 1, wherein the spin-torque oscillator is stacked on the recording unit with an insulator layer being interposed therebetween.

9. A magnetic recording apparatus comprising:
   a plurality of memory cells each including a spin-torque oscillator and a recording unit, the spin-torque oscillator including an oscillation layer, the recording unit including at least one recording layer and at least one reference layer, wherein magnetization reversal in each recording layer is performed by excitation of cooperative dynamics between magnetization of the oscillation layer and magnetization of the recording layer; and
   a controller controlling precession of the magnetization of the oscillation layer, which is induced by application of an electric current to the spin-torque oscillator.

10. The apparatus according to claim 9, wherein at least one of the at least one reference layer comprises an antiferromagnetically coupled film.

11. The apparatus according to claim 9, further comprising a read bias generator to read data recorded in the recording unit.

* * * * *